United States Patent
Arai et al.

(10) Patent No.: US 8,004,805 B2
(45) Date of Patent: Aug. 23, 2011

(54) SEMICONDUCTOR INTEGRATED CIRCUIT

(75) Inventors: Katsuya Arai, Kyoto (JP); Toshihiro Kogami, Kyoto (JP); Hiroaki Yabu, Kyoto (JP)

(73) Assignee: Panasonic Corporation, Osaka (JP)

( * ) Notice: Subject to any disclaimer, the term of this patent is extended or adjusted under 35 U.S.C. 154(b) by 347 days.

(21) Appl. No.: 12/190,949

(22) Filed: Aug. 13, 2008

(65) Prior Publication Data
US 2009/0059453 A1 Mar. 5, 2009

(30) Foreign Application Priority Data
Aug. 28, 2007 (JP) ................................. 2007-221211

(51) Int. Cl.
*H02H 9/00* (2006.01)
(52) U.S. Cl. ......... 361/56; 361/91.1; 361/111; 361/91.2
(58) Field of Classification Search .................... 361/56, 361/111, 91.1, 91.2, 91.5, 54
See application file for complete search history.

(56) References Cited

U.S. PATENT DOCUMENTS

| 5,477,413 | A  | * | 12/1995 | Watt ................................. 361/56 |
| 6,469,325 | B1 |   | 10/2002 | Ishizuka et al. |
| 6,507,469 | B2 |   | 1/2003  | Andoh |
| 6,671,146 | B1 | * | 12/2003 | Hashimoto et al. ............. 361/56 |
| 6,861,680 | B2 | * | 3/2005  | Ker et al. ...................... 257/199 |
| 7,187,527 | B2 |   | 3/2007  | Su et al. |
| 7,333,310 | B2 | * | 2/2008  | McClure ......................... 361/56 |
| 7,719,806 | B1 | * | 5/2010  | Boyd et al. ...................... 361/56 |
| 7,755,870 | B2 | * | 7/2010  | Arai et al. ....................... 361/56 |
| 2004/0033638 | A1 |   | 2/2004  | Bader et al. |
| 2004/0124473 | A1 |   | 7/2004  | Maloney et al. |
| 2006/0050453 | A1 | * | 3/2006  | Duvvury et al. ................ 361/56 |
| 2006/0114629 | A1 | * | 6/2006  | Wu et al. ......................... 361/56 |
| 2007/0058461 | A1 |   | 3/2007  | Morii |
| 2008/0158749 | A1 | * | 7/2008  | Kwak et al. ..................... 361/56 |
| 2008/0259512 | A1 | * | 10/2008 | Moon ............................. 361/56 |

FOREIGN PATENT DOCUMENTS

CN 1744310 A 3/2006
WO WO 02/33760 A1 4/2002

OTHER PUBLICATIONS

Chinese Office Action, w/ English translation thereof, issued in Chinese Patent Application No. CN 200810212656.4 dated Mar. 2, 2011.
Japanese Notice of Reasons for Rejection, with English Translation, issued in Japanese Patent Application No. JP 2003-175716, mailed Jun. 16, 2009.

* cited by examiner

*Primary Examiner* — Patrick Salce
(74) *Attorney, Agent, or Firm* — McDermott Will & Emery LLP

(57) ABSTRACT

A semiconductor integrated circuit includes an external pad, a ground line, a first protection circuit between the external pad and the ground line, and a second protection circuit between the external pad and the ground line. The second protection circuit is formed by a first protection element, a second protection element, and a resistor. With this structure, the resistance value of the resistor is set to an arbitrary value, so that an unnecessary current which would be generated at the time of power-off of the LSI can be decreased to a value which does not deteriorate the reliability of the LSI.

7 Claims, 3 Drawing Sheets

SEMICONDUCTOR INTEGRATED CIRCUIT

BACKGROUND OF THE INVENTION

1. Field of the Invention

The present invention relates to a semiconductor integrated circuit including an electrostatic discharge (ESD) protection circuit.

2. Description of the Prior Art

In recent years, semiconductor integrated circuits have been becoming vulnerable to damage by electrostatic discharge (hereinafter, referred to as "surge") due to advancement in high integration in parallel with improved device miniaturization and higher density. For example, there is a higher probability that surge which comes in via an external connection pad (external pad) destroys devices of an input circuit, output circuit, input/output circuit, internal circuit, or the like, thereby deteriorating the performance of the devices. Thus, the semiconductor integrated circuits have an electrostatic discharge (ESD) protection circuit between the external connection pad and the input circuit, output circuit, input/output circuit or internal circuit for protection from surge.

Further, a high-speed interface capable of a transfer rate on the order of several gigahertzs (GHz) has been demanded due to increased operation speed and increased number of functions in personal computers, routers, peripheral devices, etc. Therefore, for an input/output circuit used for such a high-speed interface, it is necessary to use an ESD protection circuit of a low-capacitance type which is less influential on the waveform of data to be transferred.

FIG. 4 shows the structure of a conventional ESD protection circuit. As shown in FIG. 4, the conventional ESD protection circuit includes a diode 103 which has the anode connected to an external pad 100 and the cathode connected to a power supply line 101, and a diode 104 which has the cathode connected to the external pad 100 and the anode connected to a ground line 102.

When surge of positive charge comes in via the external pad 100, a current flows from the external pad 100 to the power supply line 101 via the diode 103, so that the surge of positive charge is discharged to the power supply line 101. When surge of negative charge comes in via the external pad 100, a current flows from the ground line 102 to the external pad 100 via the diode 104, so that the surge of negative charge is discharged to the ground line 102.

In this way, the conventional ESD protection circuit protects a circuit which is to be protected.

SUMMARY OF THE INVENTION

However, according to some of a variety of high-speed interface standards, a voltage is continued to be applied to a bus line to which an input/output circuit of a high-speed interface is connected even after the power to the LSI is turned off. In this case, there is a probability that an unnecessary current flows from the external pad 100 to the power supply line 101. Specifically, in the conventional ESD protection circuit shown in FIG. 4, while the power to the LSI is off so that the power supply line 101 is 0V, application of a voltage to the external pad 100 which constitutes the bus line of the high-speed interface causes an unnecessary current to flow from the external pad 100 to the power supply line 101 via the diode 103. This can lead to an increase in power consumption of an electronic device equipped with an LSI as well as deterioration in reliability of the LSI itself.

It is also conceivable that an NMOS transistor which has the gate connected to the ground line 102, one end connected to the power supply line 101, and the other end connected to an external pad is used in substitution for the diode 103. However, the capacitance of the NMOS transistor is much larger than that of the diode, and hence, this structure has an excessively large capacitance as compared with the circuit shown in FIG. 4.

The present invention was conceived in view of the above circumstances and provides a semiconductor integrated circuit in which generation of an unnecessary current while the power to the LSI is off is prevented and increase in capacitance is prevented.

To achieve the above objective, a semiconductor integrated circuit of the present invention includes an external pad for input or output of a signal; an internal circuit connected to the external pad; a ground line; a first protection circuit which is connected to a connection path extending between the external pad and the internal circuit and which is provided between the external pad and the ground line; and a second protection circuit which is connected to the connection path extending between the external pad and the internal circuit and which is provided between the external pad and the ground line.

With this structure, basically, the protection circuit is not connected to the power supply line, and therefore, an unnecessary current which would flow when the power to the LSI is off can be reduced. In the case where the second protection circuit is formed by the first protection element and the second protection element, or in the case where the first protection element is formed by diodes over a plurality of stages, the total capacitance value of the first protection circuit and the second protection circuit (the capacitance value of the whole ESD protection circuit) is smaller than that of the conventional semiconductor integrated circuit.

The first protection circuit may have, for example, a diode which has the cathode connected to the external pad and the anode connected to the ground line.

DESCRIPTION OF THE PREFERRED EMBODIMENTS

Hereinafter, embodiments of the present invention will be described with reference to the drawings.

Embodiment 1

Figure 1:
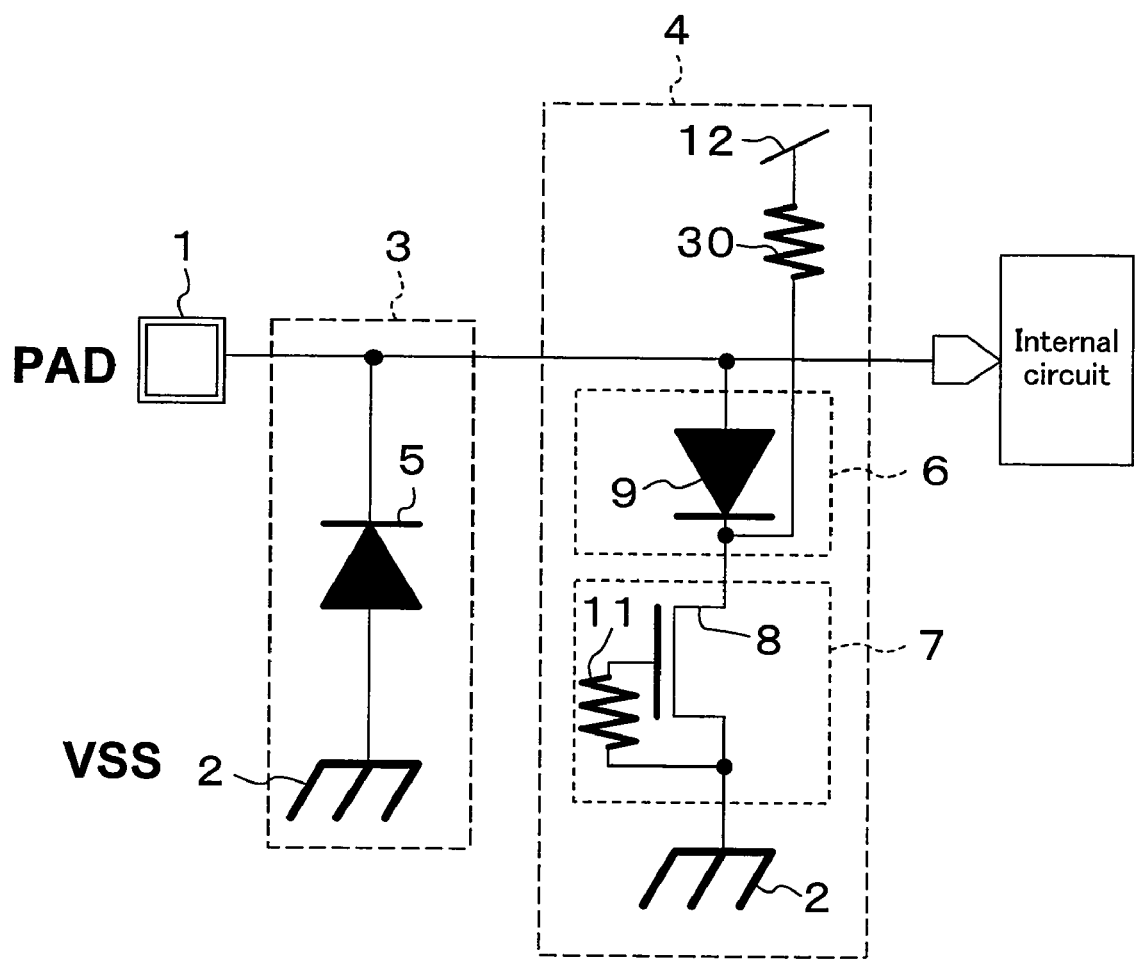
FIG. 1 shows the circuit structure of a semiconductor integrated circuit according to embodiment 1 of the present invention.

FIG. 1 shows the circuit structure of a semiconductor integrated circuit according to embodiment 1 of the present invention. In the example shown in FIG. 1, a voltage supply line is realized by a ground line.

As shown in FIG. 1, the semiconductor integrated circuit of embodiment 1 includes an external pad 1 for input or output of signals, an internal circuit connected to the external pad 1, a ground line 2, a first protection circuit 3 which is connected to a connection path extending between the external pad 1 and the internal circuit and which is provided between the external pad 1 and the ground line 2, and a second protection circuit 4 which is connected to the connection path extending between the external pad 1 and the internal circuit and which is provided between the external pad 1 and the ground line 2. It should be noted that an input circuit, output circuit, input/output circuit, or the like, may be provided between the ESD protection circuit formed by the first protection circuit 3 and the second protection circuit 4 and the internal circuit.

The first protection circuit 3 includes a first diode 5 which has the anode connected to the ground line 2 and the cathode connected to the external pad 1.

The second protection circuit 4 is formed by a first protection element 6, a second protection element 7, and a resistor 30 which has an arbitrary resistance value. The first protection element 6 includes a second diode 9 which has the anode (one end) connected to the external pad 1 and the cathode (other end) connected to the second protection element 7. The second protection element 7 includes an NMOS transistor 8 which has the source (one end) connected to the ground line 2, the drain (other end) connected to the other end of the first protection element 6 (the cathode of the second diode 9), and the gate connected to the ground line 2. Between the gate of the NMOS transistor 8 and the ground line 2, a resistor 11 having an arbitrary resistance value is provided as necessary. The resistor 30 is provided between the connection node of the other end of the first protection element 6 and the other end of the second protection element 7 (the cathode of the second diode 9), i.e., the connection node of the first protection element 6 and the second protection element 7, and the power supply line 12 from which the supply voltage is supplied.

In the semiconductor integrated circuit of this embodiment, when surge of negative charge is applied to the external pad 1 while the ground line 2 is connected to the ground, a current flows from the ground line 2 to the external pad 1 via the first protection circuit 3 (in this example, the first diode 5), so that the surge current is discharged.

When surge of positive charge is applied to the external pad 1 while the ground line 2 is connected to the ground, a current flows from the external pad 1 to the ground line 2 via the second protection circuit 4 (in this example, the second diode 9 and the parasitic npn bipolar transistor of the NMOS transistor 8), so that the surge current is discharged. With such an operation, the internal circuit is prevented from being destroyed. More specifically, surge of positive charge which comes in via the external pad 1 makes the second diode 9 conducting, so that the drain voltage of the NMOS transistor 8 increases. As a result, the parasitic npn bipolar transistor of the NMOS transistor operates to discharge the current to the ground line 2.

Figure 4:
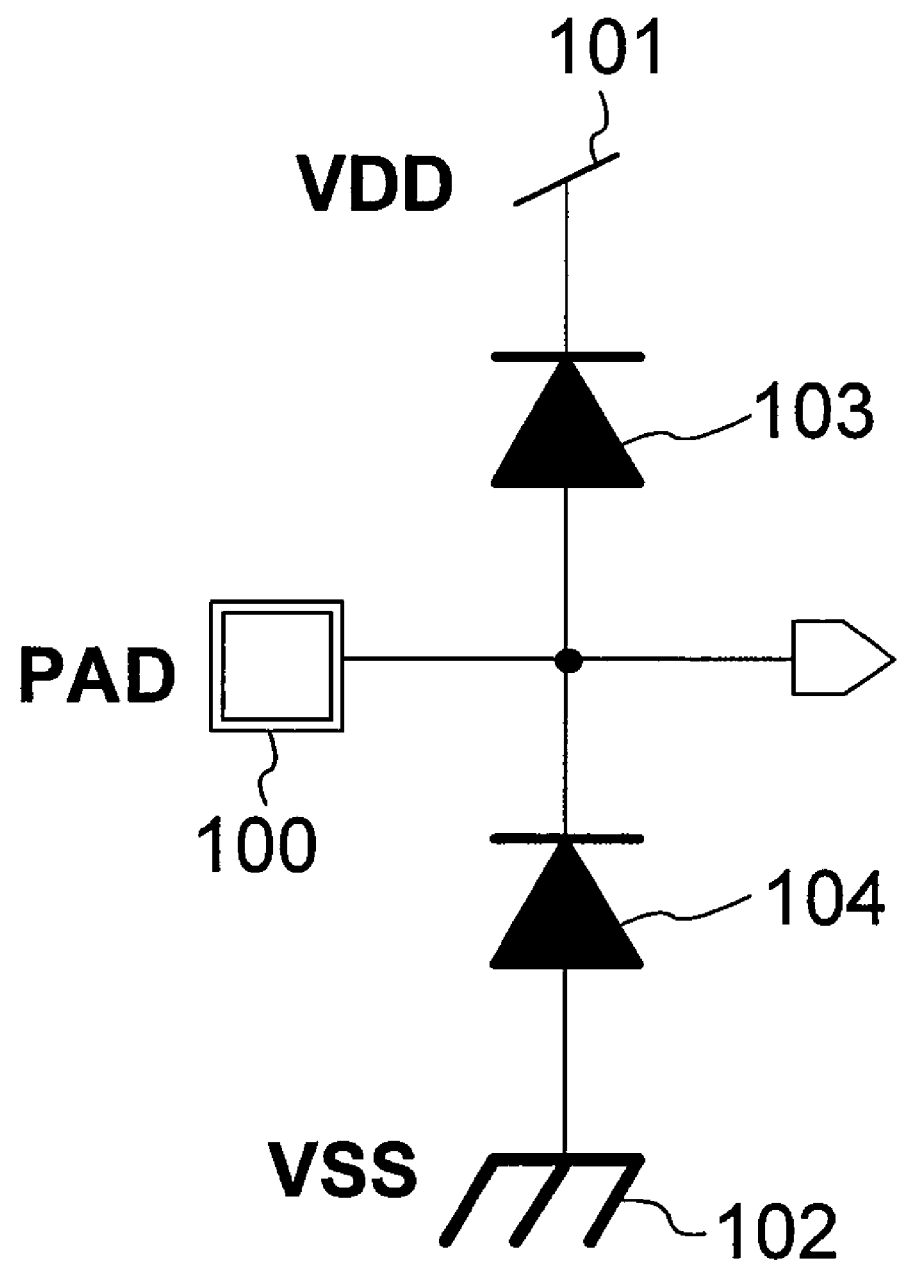
FIG. 4 is a circuit diagram showing a semiconductor integrated circuit which includes a conventional ESD protection circuit.

When this embodiment is applied to the 65 nm design rule, the capacitance of the first diode 5 is, for example, about 100 fF for the anode-cathode border length (the length of the border between anode and cathode) of 100 μm. The capacitance of the second diode 9 is about 100 fF for the anode-cathode border length of 100 μm. The capacitance of the NMOS transistor 8 is about 1000 fF for the gate width of 400 μm. The capacitance of the whole ESD protection circuit between the external pad 1 and the ground line 2 is equal to the combined capacitance of the first diode 5, the second diode 9 and the NMOS transistor 8, which is about 190 fF. On the other hand, in the conventional semiconductor integrated circuit shown in FIG. 4, the capacitance of the whole ESD protection circuit is 200 fF when the diodes 103 and 104 each have the capacitance of 100 fF. Thus, in the semiconductor integrated circuit of this embodiment, the capacitance of the ESD protection circuit can be reduced. Therefore, even when the semiconductor integrated circuit of this embodiment is used in a high-speed interface or ATAPI (AT Attachment Packet Interface) of various electronic devices, the internal circuit can be protected without causing any deformation in the signal waveform.

With the resistor 30 connected to the power supply line 12, the capacitance between the external pad 1 and the ground line 2 and power supply line 12 is equal to the total capacitance of the first diode 5 and the second diode 9 even when a high-frequency signal is input. Further, the resistor 30 has an arbitrary resistance value, and therefore, an unnecessary current which would be generated when the power to the LSI is off can be decreased to a value which does not deteriorate the reliability of the LSI.

It should be noted that the power supply line 12 and the resistor 30 are not indispensable elements for the operation of the ESD protection circuit and therefore may be omitted if unnecessary. In this case, the ESD protection circuit is not connected to the power supply line. Thus, no unnecessary current is generated even when the power to the LSI is off.

The resistor 11 is not indispensable for ESD protection. However, with the resistor 11 having an appropriately adjusted resistance value, in the case where surge of positive charge comes in, the ESD protection circuit is allowed to operate against a lower surge voltage, whereby the internal circuit can more surely be protected.

Alternatively, the first protection circuit 3 may be formed by diodes, including the first diode 5, over a plurality of stages. For example, when the voltage of a signal of the LSI is as high as a level exceeding the breakdown voltage of the first diode 5, the first protection circuit 3 needs to be formed by diodes connected in series over a plurality of stages.

The first protection element 6 may also be formed by diodes, including the second diode 9, over a plurality of stages as necessary. An NMOS transistor which has the gate and drain connected to the external pad 1 and the source connected to the second protection element 7 may be used in substitution for the second diode 9. In this case, the capacitance of the whole ESD protection circuit is large, while the releasability of surge is accordingly large, so that no unnecessary current flows when the power to the LSI is off.

Alternatively, the second diode 9 and the NMOS transistor 8 may be replaced with each other so that one end of the NMOS transistor 8 is connected to the external pad 1 while the other end of the NMOS transistor 8 is connected to the anode of the second diode 9, and the cathode of the second diode 9 is connected to the ground line 2. Even with this alternative structure, the same effects as those gained by the example of FIG. 1 can be achieved.

Also, the same effects as those gained by the semiconductor integrated circuit of this embodiment can be achieved even when the first diode 5 and the second diode 9 are formed by other types of elements than PN diodes, for example, Zener diodes, or the like.

Embodiment 2

Figure 2:
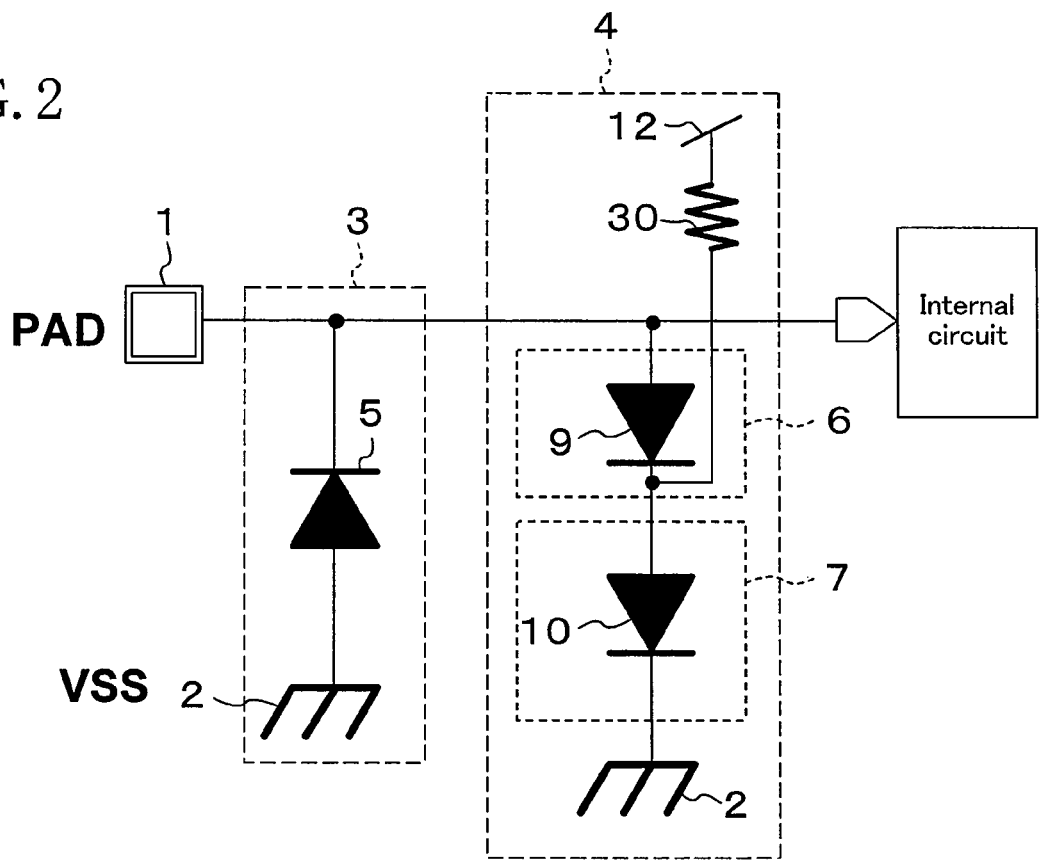
FIG. 2 shows the circuit structure of a semiconductor integrated circuit according to embodiment 2 of the present invention.

FIG. 2 shows the circuit structure of a semiconductor integrated circuit according to embodiment 2 of the present invention.

As shown in FIG. 2, the semiconductor integrated circuit of embodiment 2 includes an external pad 1, an internal circuit connected to the external pad 1, a ground line 2, a first protection circuit 3 which is connected to a connection path extending between the external pad 1 and the internal circuit and which is provided between the external pad 1 and the ground line 2, and a second protection circuit 4 which is connected to the connection path extending between the external pad 1 and the internal circuit and which is provided between the external pad 1 and the ground line 2.

The first protection circuit 3 has a first diode 5 which has the anode connected to the ground line 2 and the cathode connected to the external pad 1.

The second protection circuit 4 is formed by a first protection element 6, a second protection element 7, and a resistor 30 having an arbitrary resistance value. The first protection element 6 includes a second diode 9 which has the anode (one end) connected to the external pad 1 and the cathode (other end) connected to the second protection element 7. The second protection element 7 includes a third diode 10 which has the anode (one end) connected to the other end of the first protection element 6 (the cathode of the second diode 9) and the cathode (other end) connected to the ground line 2. The resistor 30 is provided between the other end of the first protection element 6 (the cathode of the second diode 9), i.e., the connection node of the first protection element 6 and the second protection element 7, and the power supply line 12 from which the supply voltage is supplied.

The semiconductor integrated circuit of embodiment 2 is different from the semiconductor integrated circuit of embodiment 1 shown in FIG. 1 in that the second protection element 7 has the third diode 10 in substitution for the NMOS transistor.

In the semiconductor integrated circuit of embodiment 2, when surge of negative charge is applied to the external pad 1 while the ground line 2 is connected to the ground, a current flows from the ground line 2 to the external pad 1 via the first protection circuit 3 (in this example, the first diode 5), so that the surge current is discharged.

When surge of positive charge is applied to the external pad 1 while the ground line 2 is connected to the ground, a current flows from the external pad 1 to the ground line 2 via the second protection circuit 4 (in this example, the second diode 9 and the third diode 10), so that the surge current is discharged. With such an operation, the internal circuit is prevented from being destroyed.

When this embodiment is applied to the 65 nm design rule, the capacitance of the first diode 5, the second diode 9, and the third diode 10 is, for example, about 100 fF for the anode-cathode border length of 100 μm. The capacitance of the whole ESD protection circuit between the external pad 1 and the ground line 2 is equal to the combined capacitance of the first diode 5, the second diode 9, and the third diode 10, which is about 150 fF. Thus, in the semiconductor integrated circuit of this embodiment, the capacitance of the whole ESD protection circuit is smaller than that achieved by the conventional technique. Also, the capacitance of the ESD protection circuit of embodiment 2 is smaller than that of the ESD protection circuit of embodiment 1. Therefore, the ESD protection circuit of embodiment 2 is preferably used for high-speed interfaces, and the like.

Since the ESD protection circuit is not connected to the power supply line, no unnecessary current is generated even when the power to the LSI is off.

In a design where the voltage of a signal input/output via the external pad 1 is high, the first protection element 6 and the second protection element 7 each may be formed by diodes over a plurality of stages. Increasing the number of diode stages increases the circuit area but advantageously decreases the capacitance.

Also, the same effects as those gained by the semiconductor integrated circuit of embodiment 2 can be achieved even when the first diode 5, the second diode 9, and the third diode 10 are formed by other types of elements than PN diodes, for example, Zener diodes, or the like.

With the resistor 30 connected to the power supply line 12, the capacitance between the external pad 1 and the ground line 2 and power supply line 12 is equal to the total capacitance of the first diode 5 and the second diode 9 even when a high-frequency signal is input. Further, the resistor 30 has an arbitrary resistance value, and therefore, an unnecessary current which would be generated when the power to the LSI is off can be decreased to a value which does not deteriorate the reliability of the LSI.

It should be noted that the power supply line 12 and the resistor 30 are not indispensable elements for the operation of the ESD protection circuit and therefore may be omitted if unnecessary. In this case, the ESD protection circuit is not connected to the power supply line. Thus, no unnecessary current is generated even when the power to the LSI is off.

Embodiment 3

Figure 3:
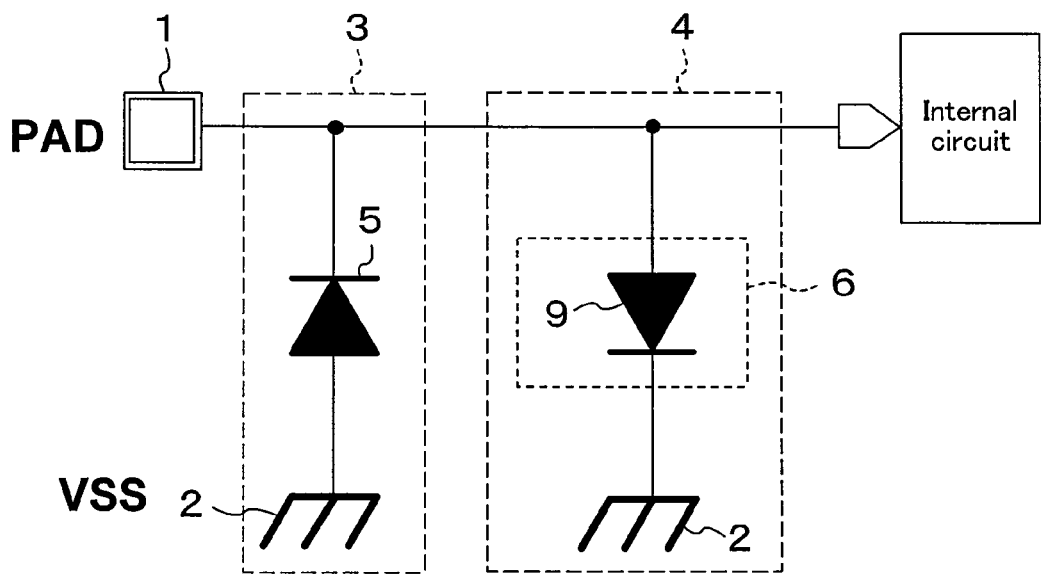
FIG. 3 shows the circuit structure of a semiconductor integrated circuit according to embodiment 3 of the present invention.

FIG. 3 shows the circuit structure of a semiconductor integrated circuit according to embodiment 3 of the present invention.

As shown in FIG. 3, the semiconductor integrated circuit of embodiment 3 includes an external pad 1, an internal circuit connected to the external pad 1, a ground line 2, a first protection circuit 3 which is connected to a connection path extending between the external pad 1 and the internal circuit and which is provided between the external pad 1 and the ground line 2, and a second protection circuit 4 which is connected to the connection path extending between the external pad 1 and the internal circuit and which is provided between the external pad 1 and the ground line 2.

The semiconductor integrated circuit of embodiment 3 is different from the semiconductor integrated circuits of embodiments 1 and 2 in that the second protection circuit 4 only includes the first protection element 6. The first protection element 6 includes a second diode 9 which has the anode connected to the external pad 1 and the cathode connected to the ground line 2.

In the semiconductor integrated circuit of embodiment 3, when surge of negative charge is applied to the external pad 1 while the ground line 2 is connected to the ground, a current flows from the ground line 2 to the external pad 1 via the first protection circuit 3 (in this example, the first diode 5), so that the surge current is discharged.

When surge of positive charge is applied to the external pad 1 while the ground line 2 is connected to the ground, a current flows from the external pad 1 to the ground line 2 via the second protection circuit 4 (in this example, the second diode 9), so that the surge current is discharged. With such an operation, the internal circuit is prevented from being destroyed.

When this embodiment is applied to the 65 nm design rule, the capacitance of the first diode 5 and the second diode 9 is, for example, about 100 fF for the anode-cathode border length of 100 μm. The capacitance of the whole ESD protection circuit between the external pad 1 and the ground line 2 is equal to the combined capacitance of the first diode 5 and the second diode 9, which is about 200 fF. It should be noted that the capacitance of the whole ESD protection circuit can be decreased by using a structure where the first protection circuit 3 is formed by diodes over a plurality of stages or a structure where the first protection element 6 is formed by diodes over a plurality of stages.

Since the ESD protection circuit is not connected to the power supply line, no unnecessary current is generated even when the power to the LSI is off.

In a design where the voltage of a signal input/output via the external pad 1 is high, the first protection element 6 may be formed by diodes, including the second diode 9, over a plurality of stages in order to prevent the signal from flowing to the ground line 2 via the second diode 9.

In a design where the voltage of a signal input/output via the external pad 1 is low, an ESD protection circuit with a smaller circuit area than embodiment 2 can be produced so long as the first protection element 6 is formed only by the second diode 9.

Also, the same effects as those gained by the semiconductor integrated circuit of embodiment 3 can be achieved even when the first diode 5 and the second diode 9 are formed by other types of elements than PN diodes, for example, Zener diodes, or the like.

The present invention as described above is usable for an ESD protection circuit of a high-speed interface of various electronic devices, such as TV sets, computers, etc., and is useful for protection of semiconductor integrated circuits.

What is claimed is:

1. A semiconductor integrated circuit, comprising:
    an external pad for input or output of a signal;
    an internal circuit connected to the external pad;
    a ground line supplied with a ground potential;
    a first protection circuit which is connected to a connection path extending between the external pad and the internal circuit and which is provided between the external pad and the ground line; and
    a second protection circuit which is connected to the connection path extending between the external pad and the internal circuit and which is provided between the external pad and the ground line,
    wherein the second protection circuit has a first protection element having an end connected to the external pad and a second protection element provided between the other end of the first protection element and the ground line, and
    the second protection circuit further includes a first resistor provided between the other end of the first protection element and a power supply line for supplying a supply voltage.

2. The semiconductor integrated circuit of claim 1, wherein the first protection circuit has a first diode, the first diode having an anode connected to the ground line and a cathode connected to the external pad.

3. The semiconductor integrated circuit of claim 1, wherein the first protection element has a second diode, the second diode having an anode connected to the external pad and a cathode connected to the second protection element.

4. The semiconductor integrated circuit of claim 1, wherein the second protection element has an NMOS transistor, the NMOS transistor having a drain connected to the first protection element, a source connected to the ground line, and a gate connected to the ground line.

5. The semiconductor integrated circuit of claim 4, further comprising a second resistor provided between the gate of the NMOS transistor and the ground line.

6. The semiconductor integrated circuit of claim 1, wherein the second protection element has a third diode, the third diode having an anode connected to the first protection element and a cathode connected to the ground line.

7. The semiconductor integrated circuit of claim 2, wherein the second protection circuit is formed only by a first protection element which has a second diode, the second diode having an anode connected to the external pad and a cathode connected to the ground line.

* * * * *